United States Patent [19]

Ingalls et al.

[11] 4,411,529

[45] Oct. 25, 1983

[54] COLOR REFERENCE DATA BASE AND METHOD OF PREPARING SAME

[76] Inventors: Marjorie D. Ingalls; Richard D. Ingalls, both of E. 1104 57th, Spokane, Wash. 99203

[21] Appl. No.: 265,995

[22] Filed: May 21, 1981

Related U.S. Application Data

[60] Division of Ser. No. 76,499, Sep. 17, 1979, abandoned, which is a continuation-in-part of Ser. No. 7,702, Jan. 30, 1979, abandoned, which is a continuation-in-part of Ser. No. 794,987, May 9, 1977, abandoned.

[51] Int. Cl.³ ............................................... G01J 3/52
[52] U.S. Cl. ................................... 356/421; 356/404; 356/243; 430/30
[58] Field of Search ............................... 356/402–406, 356/416, 421–424; 355/35, 38; 364/526; 430/30

[56] References Cited

U.S. PATENT DOCUMENTS

| | | |
|---|---|---|
| 1,703,449 | 2/1929 | Heubner . |
| 2,518,947 | 8/1950 | Simmon . |
| 2,850,563 | 9/1958 | Gretener . |
| 3,027,801 | 4/1962 | Simmon . |
| 3,152,897 | 10/1964 | Huboi et al. . |
| 3,322,025 | 5/1967 | Dauser . |
| 3,576,627 | 4/1971 | Wirth . |
| 3,674,364 | 7/1972 | Korman . |
| 3,709,686 | 1/1973 | Erdell . |
| 3,741,649 | 6/1973 | Podesta et al. . |

FOREIGN PATENT DOCUMENTS

| | | |
|---|---|---|
| 729004 | 4/1955 | United Kingdom . |
| 945,372 | 12/1963 | United Kingdom . |
| 1048581 | 11/1966 | United Kingdom . |
| 1123420 | 8/1968 | United Kingdom . |
| 1259134 | 1/1972 | United Kingdom . |
| 1282602 | 7/1972 | United Kingdom . |
| 1481242 | 7/1977 | United Kingdom . |

OTHER PUBLICATIONS

*Principles of Color Technology*, Billmeyer & Saltman, John Wiley & Sons, 1966, pp. 22–144.
*Kodak Filters For Scientific and Technical Use*, Eastman Kodak Company, New York, 1973, pp. 8–10, 12–25, 30–32, 34–36, 47–51, 57–58.
*The Reproduction of Colour*, R. W. G. Hunt, Fountain Press, London, 1967, p. 101.
*The Science of Color*, Optical Society of America Committee on Colorimetry, New York, 1953, p. 241.
*Color Science*, Wyszecki & Stiles, John Wiley & Sons, pp. 48, 240, 241.
*Handbook of Colorimetry*, Hardy, Technology Press, 1936, pp. 6, 7, 9, 10.
*Printing Impressions*, North American Publishing Company, Article entitled, "The Problems of Matching Color Samples" by F. L. Wurzburg, Jr., pp. 48, 49.
*The Reproduction of Colour*, R. W. G. Hunt, Fountain Press, Hertfordshire, England, Third Edition, 1975, Title Sheet and p. 546.
*Color Proofing, A colorful guide to pre-press proofing from 3M*, a six page leaflet available from 3M Company, bearing numeral identification 324-2264-220.
*3M Brand "Color-Key" Negative Acting Contact Imaging Material*, a two-page leaflet available from 3M Company, bearing alphanumeric designation O-TNCK-R (107.5) MP.
*ENCO "Naps" Negative-Acting Pre-Plate Color Proofing Film System*, a four page brochure available from Azoplate Division of American Hoechst Corporation, Murray Hill, N.J., bearing alphanumeric identification number JT-74-7 Nov. 1974.
*NAPS Color Proofing Film*, a four page leaflet available from Azoplate Division of American Hoechst Corporation, Murray Hill, N.J., bearing alphanumeric identification number JT-76-9.
*CORMALIN color proofs . . . better, faster, less expensive than press proofing!*, a sixteen page booklet available from E. I. DuPont de Nemours & Co. (Inc.), bearing alphanumeric identification No. E-18361.
Allen, *Journal of Paint Technology*, vol. 39, No. 509, Jun. 1967, pp. 368–376.
Smith, *The Textile Journal of Australia*, Oct. 1967, pp. 20, 22, 27 and 30.
Hunt, *The Journal of Photographic Science*, vol. 18, No. 6, Nov.–Dec. 1970, pp. 205–215.
Trezona, *Vision Research*, vol. 13, No. 1, 1973, pp. 9–25.

*Primary Examiner*—F. L. Evans
*Attorney, Agent, or Firm*—John O. Graybeal

[57] ABSTRACT

A color reference data base and method of making same by preparing colored swatches on photographic media corresponding to a plurality of color points located in the data base working area and placing each such colored swatch at its respective point within the working area, such colored swatches being prepared by selecting a set of up to three colored filters the color constituents of which, when located in the working area, determine a filter triangle such that the color point of the colored swatch or the complement thereof lies within or on the filtered triangle, determining the saturation time for each colored filter for the particular photographic media being used, computing the filter percentage needed for each colored filter, multiplying the saturation time for each colored filter by its respective filter percentage to determine its exposure time, exposing the photographic media through each colored filter for its respective exposure time, and developing the exposed photographic media.

21 Claims, 6 Drawing Figures

COLOR REFERENCE DATA BASE AND METHOD OF PREPARING SAME

CROSS-REFERENCE TO RELATED APPLICATIONS

This application is a divisional applications of our copending and now abandoned Ser. No. 076,499, filed Sept. 17, 1979, and entitled Method of Obtaining One or More Target Colors From the Light Source on Photographic Paper or the Like, and Multi-Color Proofing Procedure Utilizing Same, which is in turn a continuation-in-part of our copending and now abandoned application Ser. No. 007,702, filed Jan. 30, 1979, and entitled Method of Obtaining a Target Color From a Light Source on Photographic Film or Paper, which is in turn a continuation-in-part of our now abandoned application Ser. No. 794,987, filed May 9, 1977, now abandoned and entitled Method of Obtaining a Target Color From a Light Source on Photographic Film or Paper.

TECHNICAL FIELD

The color producing method of the present invention relates in general to the field of synthesizing a color on photographic media by the successive exposure thereof to an illuminant source through up to three colored filters. More particularly, the present invention relates to the art of preparing a colored, reference diagram or the like data base for use in determining the exposure time needed for each of three colored filters to reproduce any given color on the data base.

BACKGROUND ART

In a classic experiment which was performed by Newton as early as the year 1730, light from a test lamp was shown on a white screen and viewed by an observed. An adjacent part of the screen was illuminated by three different light sources equipped to give light of widely differing colors, typically, red, green and blue. Interestingly, it was found that by adjusting the intensities of the three colored light sources, they could be made to reproduce a combined light on the screen which would match that of the test lamp. The importance of this basic experiment is that it teaches that the light from three different colored light sources, commonly referred to as the primary lights, can combine to reproduce a test color by a technique known as additive color matching.

Once color photography was introduced it was an easy step to take to note that by shining primary lights of different colors on the same piece of photographic media, an image of their combined color would be obtained which was different from the color of the primary lights themselves. Such a concept is disclosed in U.S. Pat. No. 3,741,649, issued June 26, 1973, to Podesta et al. However, Podesta discloses merely an empirical system whereby, through trial and error, light is projected through a multitude of combinations of filters onto photographic media which is then developed to discover what usable color, if any, has been obtained. By noting which filters were used, some rudimentary repeatability of results was attainable. However, the method disclosed by Podesta makes no provision for reproducing a randomly selected target color and makes no provision for duplicating such a target color when a light source having a different color temperature is used, or when filters are used which are of colors different from those already used.

U.S. Pat. No. 3,322,025 issued May 30, 1967 to Dauser, discloses a somewhat more sophisticated, but still empirical method which involves the production of a cylindrical color solid wherein each colored segment is identified by its hue, value and intensity. The color solid is generated, apparently, by varying the voltages to three primary light sources, red, green and blue, to thereby regulate their intensities and thus produce the various colored segments comprising the color solid. Repeatability is obtained by noting the voltage input or light output of each of the respective lamps needed to produce each colored segment in the color solid.

However, such a system is severely limited since it provides only for producing the cylindrical color solid by the use of three colored lights which together are able to form achromatic light. If it is desired to use three lights which are unable to form achromatic light, what technique to use is undisclosed. Further, if a different set of achromatic lights is used, it is clear that the first produced color solid is useless and that a new color solid must be prepared for each different set of lights employed. In addition, the method's ability to faithfully reproduce a color segment is questionable since it is well known that the color properties of photographic media vary from manufacturer to manufacturer and from lot to lot. How Dauser would compensate for such variations without regenerating a complete color solid for each batch of photographic paper used is not disclosed. In addition, it is well known that the color temperature of even standardized light sources changes with age and hence the colors they produce similarly change. Again, how such aging is compensated for, without the periodic reconstruction of a complete color solid, is a problem not addressed by Dauser. Further, it is well known that varying the voltage to a light source is a crude way to regulate its intensity since as the bulb dims or brightens, the color produced by the bulb also changes. Apparently Dauser failed to consider this variable which would tend to make his color solid nonlinear. Lastly, if both positive and negative photographic media were to be used, apparently a separate color solid would have to be generated for each, a costly and time-consuming process.

Many other attempts have been made over the years to systematically organize the various colors visible to the human eye. One of the most successful of the prior systems has been the CIE system (Commission Internal de L'Eclairage, or the International Commission on Illumination). As seen in FIG. 1, color as described in the CIE system may be plotted graphically in a plane Cartesian coordinate system wherein the x values are plotted horizontally on the abscissa 10, and the y values are plotted vertically on the ordinate 12. The results of such a plot is the standard CIE 1931 chromaticity diagram, generally designated at 14, showing a horseshoe shaped spectrum locus on which the points representing the chromaticities of the spectrum colors are plotted according to their wavelengths in nanometers. A straight line 18, upon which the purples and magentas are plotted, forms the base of the chromaticity diagram and connects the lower ends 20, 22 of the spectrum locus. The standard CIE diagram 14 may be obtained from recognized works on the subject such as the *Handbook of Colorimetry* by A. C. Hardy, published in 1936 by the Massachusetts Institute of Technology.

The CIE chromaticity diagram 14 is frequently used as a reference system or reference data base as in U.S. Pat. No. 2,850,563, issued Sept. 2, 1958, to Gretener. Gretener uses the CIE diagram 14 as a theoretical basis for explaining his method of more accurately reproducing images in color through the use of photography or television. Primarily, his method achieves accurate color reproduction by properly adjusting the spectral response of the recording apparatus. For reproducing flesh tones, the spectral response is adjusted in such a manner that the flesh tones are recorded with color components having an intensity of equal size, i.e., having a unitary ratio, or in the preferred case, with only the red and green components having substantially equal intensities.

In explaining his process, Gretener discusses the use of a so-called color triangle or filter triangle 24 plotted on the CIE diagram 14 which has the primary reproduction colors 26, 28, 30 plotted at its vertices. He notes that the color triangle 24 delineates the area on the CIE diagram within which a desired color may be reproduced by the additive mixture of a suitable ratio of intensities of the primary reproduction colors 26, 28, 30. Gretener further explains that if a color is to be reproduced by the additive mixture of three colored lights, the required ratio of intensities may be derived in a well-known manner from the location of the particular target color within the filter triangle 24 formed by the primary colors. It is notable that the thrust of the Gretener patent is directed towards a method of unitizing the ratio of at least two of the primary colors.

The Gretener patent, however, fails to disclose a method by which a target color may be produced on positive photographic media by calculating the exposure time needed for each of the primary colored lights. In addition, no method is disclosed by which the proper exposure times for each of the three primary light sources may be calculated such that when negative photographic media is exposed thereto, the target color will result on the developed media. Further, no indication is given by Gretener of how, when attempting to achieve a particular target color, the target color may be accurately located on the CIE diagram as a starting point for the calculation of the exposure time needed for each of the primary light sources.

DISCLOSURE OF THE INVENTION

In basic form, the present invention is applicable to the art of obtaining a target color from an illuminant source on photographic media by preparing a colored, reference diagram or like data base characteristic of a given illuminant source; using the colored, reference data base to determine the exposure time to use with each of the three colored filters; exposing the photographic media through the three colored filters for their respective exposure times; and then developing the exposed photographic media.

The present invention involves the preparation of the colored, reference data base by selecting a plurality of points located on a working diagram by use of a grid superimposed thereon; photographically preparing a colored swatch for each point so selected; and mounting each colored swatch over its respective point. The data base, suitably in the form of colored, reference diagram, is then used for determining the red, green and blue components of a given target color.

Other aspects of the present invention specify that the exposure time to use with each of the three colored filters equals each filter's respective saturation time multiplied by its respective filter percentage. After the red, green and blue components of each of the filters are identified, each filter's respective filter percentage is determined such that the sum of the red, green and blue contributions of the three colored filters equal, respectively, the red, green and blue components of the given target color.

The red, green and blue components of the target color are determined for positive photographic media by comparing the target color to the color reference data base of the present invention and noting the point thereon whose color most closely matches that of the target color. When negative photographic media is used, a further step is required which comprises finding the data base coordinates of the color which is the complement of the target color. Then, the red, green and blue components of the color needed to produce the target color are determined for positive and negative photographic media by utilizing the x, y and z coordinates, or data base equivalent thereof, of the target color, and its complement, respectively.

Another object of the present invention is to provide a method whereby, once a color reference data base is produced, variations caused by changes in the properties of the photographic media being used may be compensated for without reconstruction of the data base.

A further object of the present invention is to provide a method whereby a given target color may be produced with any illuminant source no matter what the color temperature of the illuminant source may be.

Another object of the present invention is to provide a method whereby once a particular target color is synthesized, it may be repeatedly reproduced.

Further objects and features of the present invention involve the development and use of a color reference data base for accurate color reproduction of one or more target colors on photographic print media by use of an illuminant source and sets of color filters, which data include and interrelate (1) the chromaticity coordinates, dominant wavelength, and saturation percentages for each possible target color in relation to the given illuminant source, and (2) the chromaticity coordinates and filter percentages characteristic of each filter for each target color in relation to the illuminant source. Optionally, the data can also include, or can in part be expressed in terms of target color densities, i.e. the gray level and the proportionate levels of red, yellow and blue in each target color.

These and other objects, features, advantages and characteristics of the method of my present invention will be apparent from the following detailed description of the preferred embodiments thereof in which reference is made to the accompanying figures.

DESCRIPTION OF THE PREFERRED EMBODIMENTS

Figure 1:
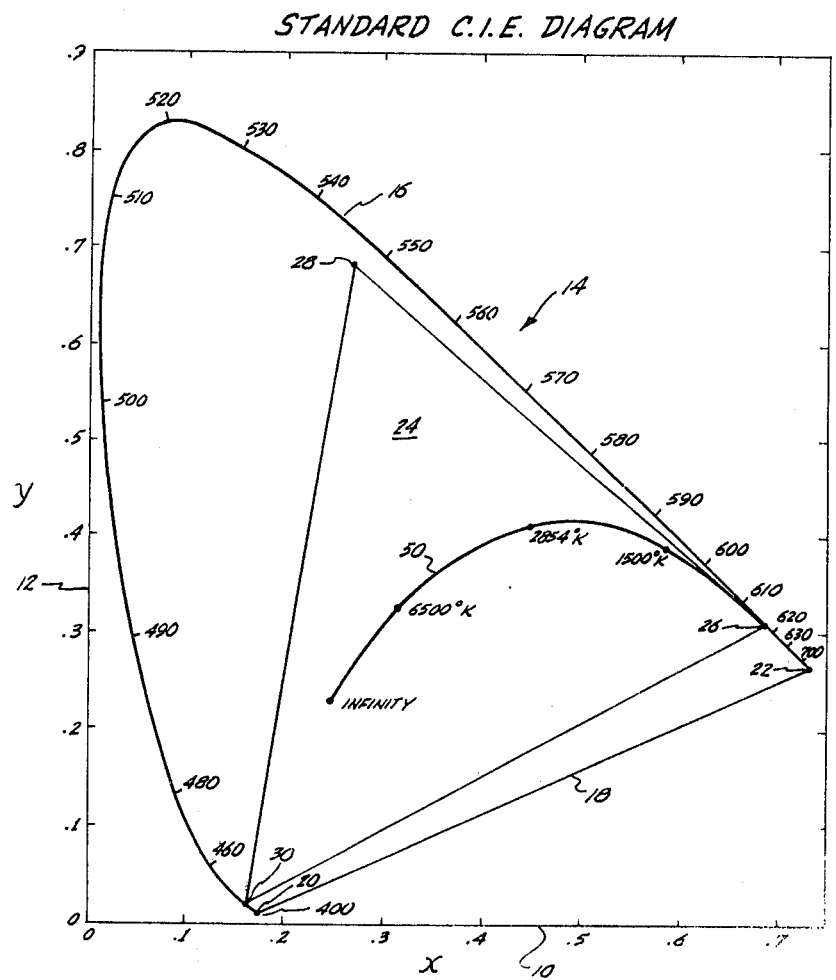
FIG. 1 is a pictorial representation of a standard CIE diagram.

It should be noted that applicants' present method has a great advantage in that it can be utilized to produce the target color with an illuminant source having any color (Kelvin) temperature. However, for the most accurate results, certain constraints in the color temperature of the illuminant source must be observed.

As is explained in greater detail subsequently, the color temperature of the particular illuminant source used affects the location on the working diagram of many of the plotted points utilized in the present method. Among the plotted points affected are those for the illuminant source, the filters, the target color and the complement of the target color. In addition, it will be seen that the pattern of colors making up the color reference data base will also change as the temperature of the illuminant source changes, as will the saturation times of the color filters.

Thus, it will become apparent that for best results in practicing the method of the present invention, the illuminant source used in preparing the color reference data base and in determining the filters' saturation times should have the same Kelvin temperature as that used to produce the target color. This same temperature must also be used in determining the coordinates or equivalent data point of the illuminant source, the filters, the target color, and the complement of the target color. The temperature of the illuminant source may be easily determined in many ways, as for example, with a Kelvin meter.

In addition, the illuminant source(s) should also have the same spectral distribution. The spectral distribution of an illuminant source may be obtained from a variety of sources, including its manufacturer. Naturally, even though the properties of a particular illuminant source slowly change as it ages, one can ensure to a considerable degree the desired constancy of illuminant color temperature and spectral distribution merely by using the same illuminant source throughout practice of the methods of the present invention. Failure to use illuminant sources of the same color temperature and spectral distribution will cause some inaccuracy in the results obtained which may be acceptable if the particular user does not need a high degree of accuracy.

For the purposes of the present invention it may be assumed that most incandescent illuminant sources of the same Kelvin temperature have substantially the same spectral distribution, and thus an independent determination of spectral distribution need not be made. Of course, if inaccurate results are encountered, then the spectral distributions must be checked. Care must be taken since nonincandescent illuminant sources, such as fluorescent light, seldom have the same spectral distribution as an incandescent illuminant source of the same color temperature.

In order to properly understood and carry out the illustrative method of the present invention as diagrammed in FIG. 2, and shown in FIG. 3, a brief overview of the method is set forth below, along with a discussion of the method's underlying principles.

Preliminarily, for purposes of discussion of the present invention, it is assumed that every color visible to the human eye is composed entirely of red, green and/or blue components. Thus, it follows that any such color may by synthesized by the proper additive mixing of red, green and blue lights. However, the problem remains of how to determine what are the red, green and blue components of a given target color, and how to select and use color filters which will extract the proper amounts of red, green and blue light from a given illuminant source to reproduce that color on the particular photographic media being used.

Figure 2:
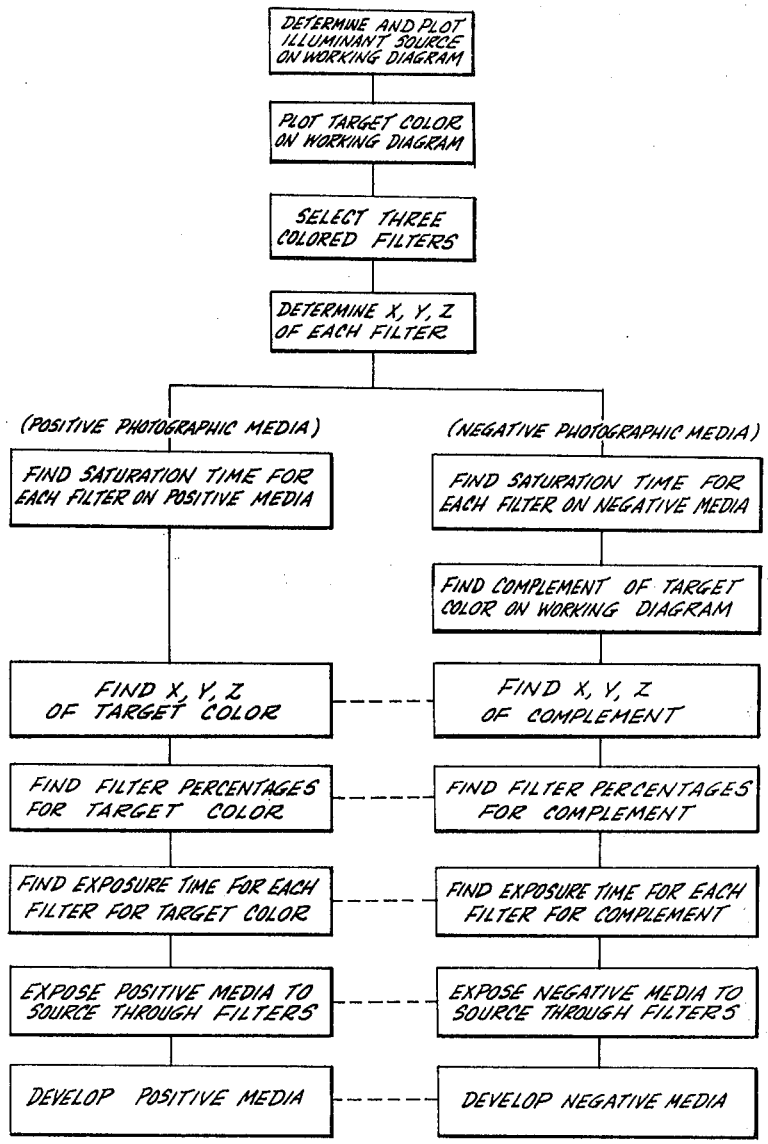
FIG. 2 is a block diagram outlining one of the methods to which the present invention is applicable.

Since, as has been explained, the color temperature of the illuminant source is a basic factor which must be considered in the present method, the starting point for the present method, as shown in FIG. 2, is to determine the Kelvin temperature of the illuminant source which will be used to produce the target color. Having determined the color temperature of the illuminant source, it may then be located as by plotting thereof on the diagram working area 15 for whatever use is to be made of it. For example, this point is useful in determining such information as the dominant wavelength of the target color and the complement of the target color. At this time the spectral distribution may also be determined, as by reference to its manufacturer's specifications.

Figure 3:
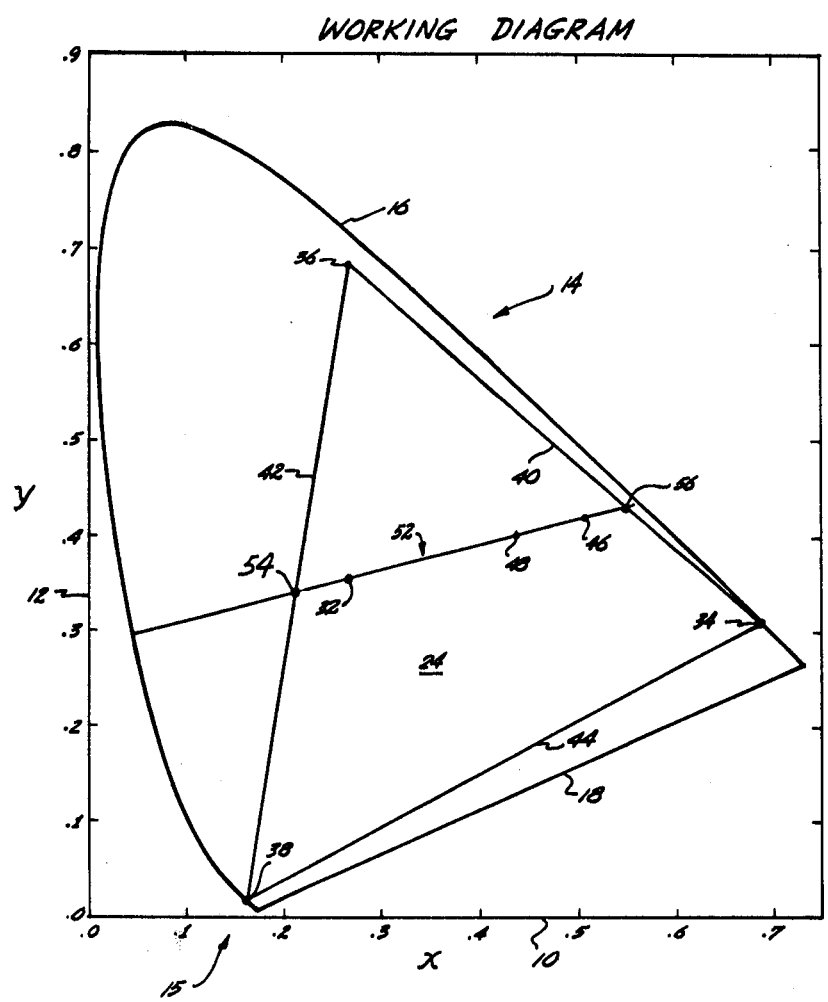
FIG. 3 is a pictorial representation illustrating the use of a working diagram in the present invention.

Next, as shown in FIG. 3, the data point is determined in the data base working area for the color to be achieved, i.e. the target color 32. This is done by comparing the target color to a color reference data base which was prepared with an illuminant source having the same color temperature and spectral distribution as the illuminant source being used to produce the target color. The location of the closest matching color on the data base, e.g. the coordinates of the matching color on the color reference diagram, is taken to be that of the target color. These coordinates are then used to plot the target color on the working diagram 15, shown in FIG. 3.

Then, a set of three filters 34, 36, 38 is selected which can be used to produce the particular target color 32. In order to determine whether a given set of three filters can be used to achieve a particular target color, all of the color filters being considered must first be located on the data base. As has been explained, since the location of each filter depends upon the Kelvin temperature and the spectral distribution of the illuminant source used, the data point chosen for each filter must be that determined for an illuminant source having a Kelvin temperature and a spectral distribution which is the same as that used to produce the target color.

Filter triangle plots, or data base equivalent thereof, are then delineated and any set of three filters may be used which defines a filter triangle or equivalent coincident with the location of the target color. This is because, when considering photographic media, a set of three filters may be used to produce any color located within or on the filter triangle they define. It is to be understood that if none of the filter triangles satisfies this requirement, additional or different filters are necessary in order to produce the target color on the photographic media.

In order to determine what are the red, green and blue components of the target color 32 and of each of the color filters 34, 36, 38 are, the same working area 15 upon which the target color and the three color filters have been plotted can be used. For the purposes of the present invention, the x coordinate of the plotted point for the target color 32 and for each filter 34, 36, 38 is taken to represent its red component, and its y coordinate is taken to represent its green component. Since any color is understood to equal the sum of its red, green and blue components, it follows that each color's blue component, which is designated as z, may be calculated according to the equation: $z=1-(x+y)$. Accordingly, once the position of the target color 32 and of each of the color filters 34, 36, 38 is known on the working diagram, the size of their red and green components may be read directly from the working diagram, while their blue components may be easily computed by the use of the formula given. Using this procedure, the x, y, z coordinates of each color filter are determined, which represent, of course, their red, green, and blue components, respectively.

At this point it should be noted that, as seen in FIG. 2, somewhat different procedures are used depending on whether positive or negative photographic media are to be utilized to produce the target color. The method for positive photographic media is next discussed below.

Since the goal is to reproduce the target color photographically, and not by matching colored lights on a screen as were used to produce a standard CIE diagram, it is necessary to find the exposure time needed for each of the three color filters being used. This is done by first determining the saturation time for each color filter 34, 36, 38 for the particular positive photographic media being utilized. Briefly, this may be accomplished for each color filter by making a series of successively longer exposures through the filter onto the photographic media, until lengthening the exposure time produces an observable change in the color found in the developed media. The first exposure time which achieves this result is considered to be the saturation time for that particular color filter.

Next, as seen in FIG. 2, the red, green and blue components of the target color are obtained by means of the previously described procedure which starts with noting the target color's x, y coordinates on the working diagram and then using the formula $z=1-(x+y)$ to compute its blue component.

Once the red, green and blue components of the target color and of each of the three color filters are known, it must then be discovered how much of each color filter is needed in order to produce the target color. This is done by determining what percentage of each color filter is needed to achieve a result such that the sums of their red, green and blue contributions equal, respectively, the red, green and blue components of the target color. This determination of the filter percentage needed for each color filter may be made by conventional mathematical techniques.

Having obtained the filter percentage needed for each color filter, each filter's exposure time is obtained by multiplying its respective saturation time by its respective filter precentage. Finally, the particular, positive photographic media being used is exposed sequentially to the illuminant source through each color filter for its respective exposure time. Upon developing the photographic media in accordance with the manufacturer's instructions, the target color is produced on the developed positive photographic media.

It should be again noted that the method just described for positive photographic media is altered somewhat to make it suitable for use with negative photographic media, which is the media preferred by most of those skilled in the photographic art. However, as seen in FIG. 2, both methods have many steps which are similar and these steps have been connected by dotted lines. One of the similar steps is the determination of the saturation time for each of the color filters on the particular negative photographic media being used. This step is performed analogously to the step heretofore described for determining the saturation time for each of the color filters on positive photographic media.

However, the differences in the methods, which are seen in FIG. 2, may be accounted for by the fact that, as is known, when negative photographic media is exposed to light of a color that is the same as the target color, the target color will not result when the negative photographic media is developed. Instead, a color will result which approximates the complement of the target color. Another possibility is that of obtaining a given target color by exposing negative photographic media to light whose color is the complement of the target color. In a procedure which is described in more detail subsequently, the location on the working diagram for the complementary color 46 is found through use of the plotted point for the target color 32, the plotted point for the illuminant source 48, and the CIE diagram 14.

Once the location of a complement of the target color has been found on the working diagram, the remaining steps in the procedure for negative photographic media set out in FIG. 2 are performed analogously to the similar steps set out in the procedure for positive photographic media. The only difference is that the "working color" in the method for positive photographic media is the target color, while in the method for negative photographic media, the "working color" is a complement of the target color. Hence, the remaining steps of the procedure set forth for negative photographic media need not be described further since the similar steps are performed analogously.

It will be apparent that the sequence of steps shown in FIG. 2 need not be performed in exactly the sequence given. For example, in the method shown for positive photographic media, the coordinates of the target color can be found any time after the target color has been plotted on the working diagram, but before the filter percentages are found. Similarly, the saturation time for each filter can be found any time after the three color filters have been selected, but before their exposure times are determined. In the same vein, the filter percentages can be found any time after the coordinates of the three filters and the target color are known, but before the exposure times are found. Analogous comments apply to the method shown in FIG. 2 for negative photographic media. Other workable sequences of steps will be apparent to those skilled in the art from the foregoing description, and from the more detailed description of the methods of the present invention which follow.

To further illustrate the significant features of the methods of the present invention set forth in FIG. 2, the following detailed example is presented. Example:

A swatch of a bluish color was chosen to be the color for reproduction, i.e. as the target color 32. However, any color visible to the human eye could have been selected.

Then, through the use of a Kelvin meter, the illuminant source was found to have a color temperature of approximately 3050° Kelvin. By using the locus of black body light sources 50, shown in FIG. 1, it was possible to determine the illuminant source's x, y coordinates for plotting on the working diagram 15. The locus of black body light sources 50 may be obtained from any standard reference work on the subject, such as *The Science of Color*, published by the Optical Society of America, and provides the coordinates of an ideal, black body radiant source for all possible temperatures. The x, y coordinates of the illuminant source 48 were taken to be the same as the coordinates of the point on the locus 50 having the same color temperature as the illuminant source 48 used. Since its temperature was determined to be 3050° Kelvin, this meant that the illuminant source 48 had the coordinates x=0.4325, y=0.4050.

Next, a color reference data base in the form of a CIE diagram was obtained, or was produced according to the more detailed description which follows, with an illuminant source of a color temperature and a spectral distribution the same as that of the illuminant source being used to prepare the target color. Then, the target color was compared to the color reference diagram and it was noted that the x, y coordinates of the closest matching color thereon were x(red)=0.211 and y(green)=0.3425. Using these coordinates, a point for the target color 32 was plotted on a working diagram 15 as shown in FIG. 3. It is to be understood that the working diagram 15 need not necessarily include the CIE diagram 14, except possibly for certain steps explained subsequently, but may instead be any Cartesian coordinate system or equivalent data base, such as a computer program, having units which can be correlated with those used in a standard, CIE diagram. For example, a known data system involving programming a digital computer to determine CIE coordinates from spectro photometric data is disclosed by J. E. McCarley et al in an article entitled "Digital System for Converting Spectro-photometric Data to CIE Coordinates, Dominant Wavelength and Excitation Purity, at 55 Journal Of The Optical Society of America, pp 355-360 (April, 1965). Other data systems known per se may also be used without departing from the scope of the present invention.

In the example being discussed, three color filters 34, 36, 38 were selected to be plotted on the working diagram 15. Preferably, the filters used should have excellent optical quality so that they will not diffuse the light transmitted therethrough, and should be of uniform color throughout to avoid color variations in the results produced. Since dyes used to produce precision filters gradually change color with age, it is preferred that the filter be selected to be as color stable as possible. Filters found to be particularly suitable are produced by the Eastman Kodak Company and are generally designated as being Kodak Wratten Photomechanical Filters. In this example, the filters chosen were the Kodak Wratten Photomechanical filters numbered 25 (red), 58 (green) and 47B (blue), and have been designated as filters 34, 36, 38, respectively.

In order to plot the filters on the working diagram, it is necessary to determine their x, y coordinates or data point equivalents thereof. This may be done either by referring to the manufacturer's reference data, or by use of a spectrophotometer, or by direct comparison of the colored filters to the color reference diagram to find the coordinates of the closest matching color thereon, for example.

When a filter's coordinates are found by comparison with the color reference diagram, the filter should, of course, be illuminated by an illuminant source whose color temperature and spectral distribution are the same as that of the illuminant source which was used to produce the target color and the color reference diagram. Similarly, when the filter's coordinates are being found by referring to the manufacturer's reference data, the coordinates listed therein must be chosen which were prepared using an illuminant source whose color temperature and spectral distribution are as close as possible to that of the illuminant source used to produce the target color and the color reference diagram.

As indicated, the illuminant source 48 used in this example is a tungsten light whose color temperature was found, through the use of a Kelvin meter, to be approximately 3050° Kelvin. To find the x, y coordinates of the filters 34, 36, 38, reference was then made to the booklet, "Kodak Filters for Scientific and Technical Use", published by Eastman Kodak Company of Rochester, N.Y. This booklet lists the x, y coordinates of each filter produced by the Eastman Kodak Company for illuminant sources of several color temperatures. The data selected were those listed for Standard Illuminant A, as specified by the International Commission on Illumination, which is a tungsten light having a color temperature of 2856° Kelvin. Since the color temperature differed by only 194° Kelvin, a fairly close match was found for the illuminant source being used. Of course, more accurate results can be obtained through interpolation of the reference data supplied by the manufacturer.

The three filters were then plotted on the working diagram shown in FIG. 3 using the following coordinates which were supplied by the manufacturer for Standard Illuminant A:

| Filter | x (red) | y (green) | z (blue) |
|---|---|---|---|
| 25 (red) | .6850 | .3147 | .0003 |
| 58 (green) | .2693 | .6831 | .0476 |
| 47B (blue) | .1554 | .0220 | .8226 |

The z coordinates were, of course, obtained through the use of the formula $z=1-(x+y)$.

After the filters were plotted, straight lines 40, 42, 44 were drawn interconnecting the red and green filters, the green and blue filters, and the blue and red filters, respectively, to form a filter triangle 24, as seen in FIG. 3. It was observed that the target color lay within this filter triangle and thus these three filters are suitable ones to use to produce the target color.

As has been noted, the method of FIG. 2 when used to produce the target color on positive photographic media, differs somewhat from that used to produce the target color on negative photographic media. Each method is therefore described separately below, with the method for positive photographic media being addressed first. The positive print paper Kodak Ektachrome R.C. paper type 1993, manufactured by Eastman Kodak Company was used.

First, the saturation tiem for each color filter was determined for the particular, positive photographic paper being used. This is an important step since the color qualities of photographic paper may vary from batch to batch, as is reflected by the color guide numbers found printed by the manufacturer on each box of photographic paper. In this step also, it is important that the color temperature and spectral distribution of the illuminant source used to obtain the saturation time be the same as that used to produce both the color reference diagram and the target color. To determine each filter's saturation time, as has been explained, a series of sequential exposures of lengthening time are taken through it on the photographic media being used, and when no change in color is observed in the developed paper, the first exposure time to produce that color is the saturation time for that filter. Accurate checks on the saturation time are made by making successive exposures with only a small increase in exposure time and by checking the change in color found in the developed paper with a densitometer. In the example selected, the saturation times for the red, green and blue filters were found to be, respectively, 35.3 seconds, 37 seconds and 20.1 seconds.

After the saturation times have been determined for each filter, a final check on the accuracy of the result can be made by trial production of a gray at the plotted point for the illuminant source 48. This can be done by employing the method set out in FIG. 2, and then, in this method, specifying the target color to have the coordinates of the plotted point for the illuminant source. Whether a gray has been achieved may be checked, for example, by comparing the resulting color with a standard reference work such as the True Color Process Guide, published by Krug Litho Art Co., of Kansas City, Mo., or by checking the sample on a reflective digital densitometer such as a GAM Model 126P, available from the Graphic Arts Manufacturing Company. If it is found that a gray has not been achieved, the dominant color(s) are observed and the exposure time(s) for the filter(s) are adjusted, as is known to those skilled in the art, until a gray is obtained.

One of the advantages of the method of the present invention is that once the saturation times for particular color filters are known for an illuminant source of a certain Kelvin temperature, variations in the color density of the paper or in the color guide numbers on different boxes of paper may be compensated for (to produce a gray), as is also known to those skilled in the art, without experimentally redetermining the saturation times for the color filters.

One further factor that should be emphasized, in order to ensure the accuracy of the results obtained by the method of the present invention, is that care must be taken to ensure that the intensity of the illuminant source used to determine the saturation times is the same as the intensity of the illuminant source used to expose the photographic paper when achieving the target color. The constancy of the intensity may be insured by measuring the illuminant source with a light meter; or by keeping the voltage applied to the illuminant source and the distance from the illuminant source to the photographic paper invariant. Alternatively, changes in the intensity may be compensated for as is known to those skilled in the art.

After the saturation times were determined, the x, y coordinates of the target color were noted from the working diagram to be $x(red)=0.211$ and $y(green)=0.3425$. The blue coordinate was found to be $z=0.4465$ using the formula $z=1-(x+y)$.

Next, the filter percentages for the red, green and blue filters, in relation to the target color were found to be 0%, 48.1%, 51.9%, respectively. These filter percentages (the proportionate filter exposures necessary to essentially reproduce the target color from the filter colors) ar obtained by interpolatively correlating the target color coordinates and the filter color coordinates. Thus, for example, the dominant filter 47B (blue) can be expected to provide the dominant target color component (z coordinate 0.4465) and will approximately do so at a filter percentate of 52%, $(0.4465-0.42775=0.01875$ error). Similarly, the second significant color coordinate of the target color (y coordinate 0.3425) can be provided primarily by the filter 58 (green) which it will approximate at a filter percentage of 48%, taking into account the y component (green) contribution (0.0114) of the 47B filter (blue) $(0.3425-0.0114-0.3279=0.0032$ error), with this filter 58 (green) also substantially providing the third target color component (x coordinate 0.2110) at the same filter percentage along with the x (red) component contribution (0.0808) of the 47B filter $(0.2110-0.0808-0.1293=0.0009$ error), and making a z component (blue) contribution (0.02285) reducing the blue error in the 47B and 58 filter contributions $(0.01875-0.02285=-0.0041$ error). Refinement of the interpolations result in the indicated respective filter percentages for the selected filters, in relation to the selected target color, of 0% for the 25 filter (red), 48.8% for the 58 filter (green), and 51.9% for the 47B filter (blue).

By multiplying the red, green and blue filters' respective filter percentages by their respective saturation times, the desired exposure times for the respective filters were found to be 0 seconds, 17.8 seconds, and 10.4 seconds, respectively.

The last steps involve sequentially exposing the photographic paper to the illuminant source through each of the up to three color filters for its respective exposure time. After the last exposure is made, the positive photographic media is developed in accordance with the manufacturer's instructions, with the result that the target color is obtained on the developed positive photographic paper.

Turning now to an illustration of the method to be used to produce the target color on negative photographic media, it is again notable that several of its steps differ from those used in the method to produce the target color on positive photographic media. However, the substantial similarities which have been previously mentioned should be kept in mind. The negative photographic media used in the selected example is Kodak Ektacolor 37RC, type 2290, negative photographic print paper manufactured by the Eastman Kodak Company of Rochester, N.Y.

As in the method for positive photographic media, the method for negative photographic media began by determining the color temperature of the illuminant source and then plotting it on the working diagram. Similarly, the target color 32 was also plotted on the working diagram. Three suitable colored filters 34, 36, 38 were selected, as before, by plotting the three color filters on the working diagram, and drawing straight lines 40, 42, 44 to joint them to form a filter triangle 24. It was to be determined, as before, that the red, green and blue filters 34, 36, 38 are suitable for use. The x, y, z coordinates of each were determined, as has been described, to be the same as set forth in the method for positive photographic media.

Next, the saturation time for each color filter was determined for the negative photographic media in a manner analogous to that previously described for positive photographic media. The results were that the red, green and blue filters 34, 36, 38 have saturation times of 38.4 second, 21.3 seconds and 28.8 seconds, respectively, on the negative photographic paper.

It will be recalled that, in order to obtain the target color on the negative photographic media, the negative photographic media is exposed to a light whose combined color is complementary to that of the target color. The coordinates are equivalent data point of this complementary color 46 is to be determined in order to synthesize it using the three colored filters. This can be done, for example, by using the CIE diagram 14, which is now drawn on the working diagram 15. Referring now to FIG. 3, a straight line generally designated as 52 was drawn between the plotted points for the target color 32 and the illuminant source 48 as the initial step. The straight line 52 was then extended to intersect opposite sides of the CIE diagram 14 at points 54, 56.

The percentage of the distance the plotted point for the target color 32 lies on the straight line 52 between the illuminant point 48 and intersection point 54 is now determined. In the selected example, it was found that, as shown in FIG. 3, the target color lay 56% of this distance. The coordinates of the complementary color 46 of the target color 32 are then determined by proceeding along the straight line 52 from the plotted point for the illuminant source 48 towards the intersection point 56 on the far side 16 of the CIE diagram 14. The distance traveled is such that if the plotted point for the target color 32 lies 56% of the distance along the line between the plotted points for the illuminant source 48 and the near side of the filter triangle, then the complementary color 46 lies the similar percentage of the distance between the plotted point for the illuminant source 48 and the far side 40 of the filter triangle. From FIG. 3 it is shown that the coordinates corresponding to the complementary color 46 were $x=0.5050$, and $y=0.425$. The z coordinate, calculated in the usual manner, was found to be $z=0.07$.

Next, the filter percentages needed to produce the complementary color is determined in the usual manner, using the x, y, z coordinates determined for the complementary color 46, and for the three colored filters 34, 36, 38. As a result, the red, green and blue filters 34, 36, 38 were found to have filter percentages of 58%, 36% and 6%, respectively. By multiplying each filter's respective filter percentage by its respective saturation time, each filter's exposure time needed to produce the complementary color was found to be 22.3 seconds, 7.7 seconds and 1.7 seconds, respectively.

When the negative photographic media was exposed to each of the color filters for its respective exposure time, and developed in accordance with the manufacturer's instructions, it was found that, as expected, the target color had been reproduced on the developed paper.

Turning now to other considerations, it may be that when the target color is compared to the color reference diagram in accordance with the method set forth in FIG. 2 for both positive and negative photographic media, a close match for the target color is not found. In that case, it is apparent that the target color is either a tint (lighter than) or a tone (darker than) of the closest matching color found on the color reference diagram. It will be seen that, by using the methods that are diagrammed in FIGS. 2 and 4, any target color may be accurately reproduced, which is one of the significant advantages of the present invention.

Figure 4:
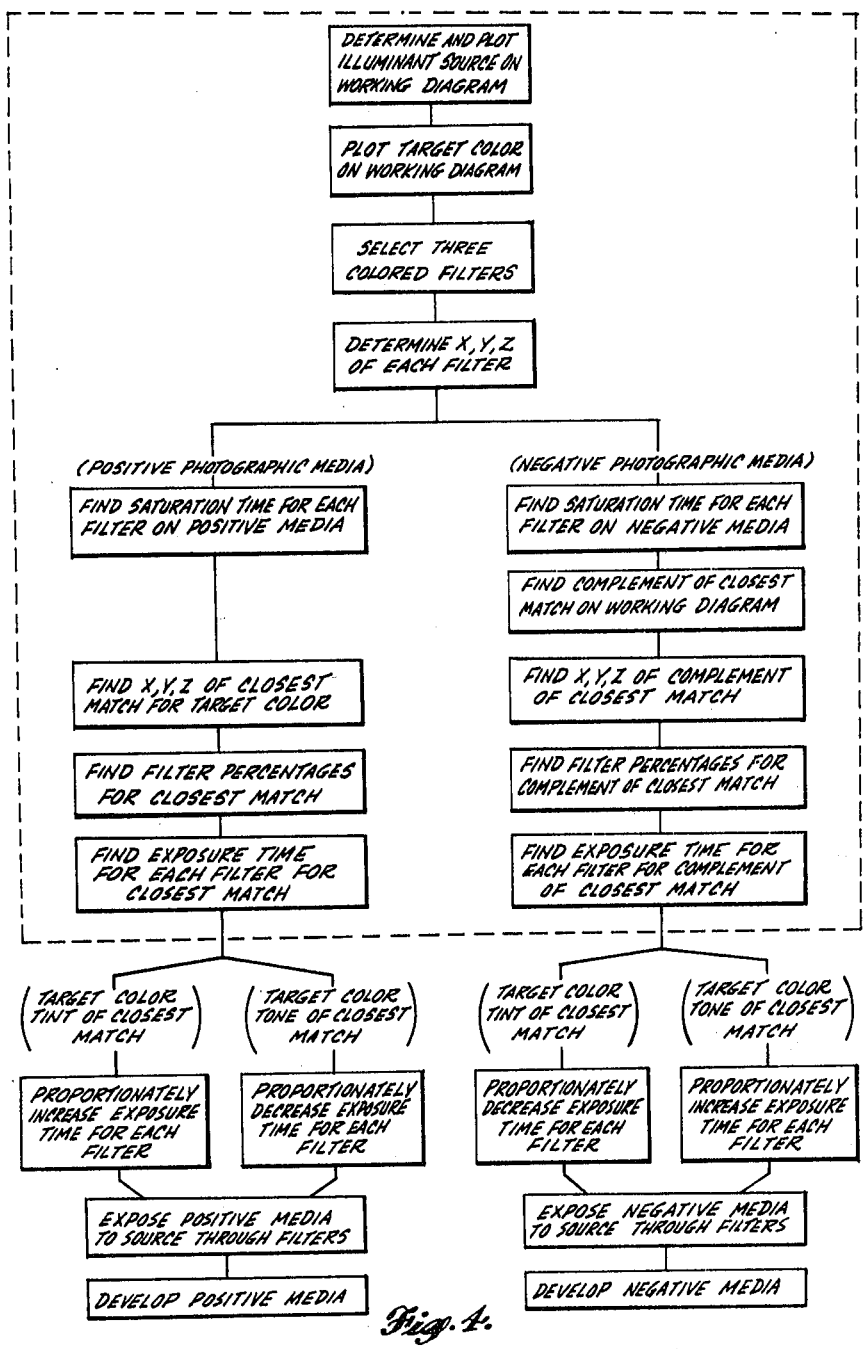
FIGS. 4 and 5 are block diagram outlines of other methods to which the present invention is applicable.

However, in order to obtain accurate results when the target color is a tint or a tone of the closest matching color, it is necessary to use the method as set forth in FIG. 4 which is based on, but is a refinement of, the method of FIG. 2. In fact, it has been observed that the steps of the method set forth in FIG. 4 which are enclosed by a dotted line are directly analogous to the corresponding steps of the method set forth in FIG. 2. When using positive photographic media in the method of FIG. 4, the only difference is that instead of determining the exposure time for each color filter for the target color, the exposure time for the closest matching color is determined. When using negative photographic media in the method set forth in FIG. 4, the only difference is that, instead of determining the exposure time for the complement of the target color, the exposure time for the complement of the closest matching color is determined.

Once the exposure time for each filter for the closest matching color or its complement is determined, different methods are needed, as shown in FIG. 4, depending on whether positive or negative photographic media is used to produce the target color.

If it is found that the target color is a tint of the closest matching color, and if positive photographic media is used, a series of exposures are made, using as a basis the exposure time for the closest matching color. In the series of exposures, the exposure times for all of the filters are proportionally increased, resulting in a hue of lighter and lighter tint on the developed photographic media until the target color is reached. If negative photographic media is used, the exposure time for each of the filters that was found for the complement of the closest matching color is proportionately decreased and again, a series of exposures are taken. The result is a hue of a lighter and lighter tint on the developed negative photographic media until the target color is reached.

If the target color is found to be a tone of the closest matching color, again different methods are used depending on whether positive or negative photographic media are employed, as seen in FIG. 4. In the case of use of positive photographic media, the exposure time for each of the color filters found for the closest matching color is proportionately decreased and a series of exposures is made, each with a shorter and shorter exposure time. The result in the developed positive photographic media is a hue of darker and darker tone until the target color is reached. If negative photographic media are used, the exposure time for each of the color filters found for the complement of the closest matching color is proportionately increased. A series of exposures is made, each having a longer exposure time, until the target color is finally obtained in the developed, negative photographic media.

Since it is fundamental to the methods shown in FIGS. 2 and 4 that the target color be located on the working diagram 15, it is apparent that an accurate, detailed, color reference data base must be available against which the target color can be matched, in order to find its coordinates. At present, applicants are aware of no existing color reference data base which fulfills the requirements necessary for the proper practice of the present invention. At best, the only color reference data bases of which applicants are aware consist of relatively crude painted reproductions of the colors appearing on a standard CIE diagram. The reason for the lack of a color reference data base may be that the CIE system is not associated with any particular set of physical samples. Instead, the system is based on the concept of additive color mixing as derived from experiments in which a colored light from a test lamp is shown on a white screen and is then matched by mixing three primary colored lights on the screen adjacent the test light.

Figure 5:
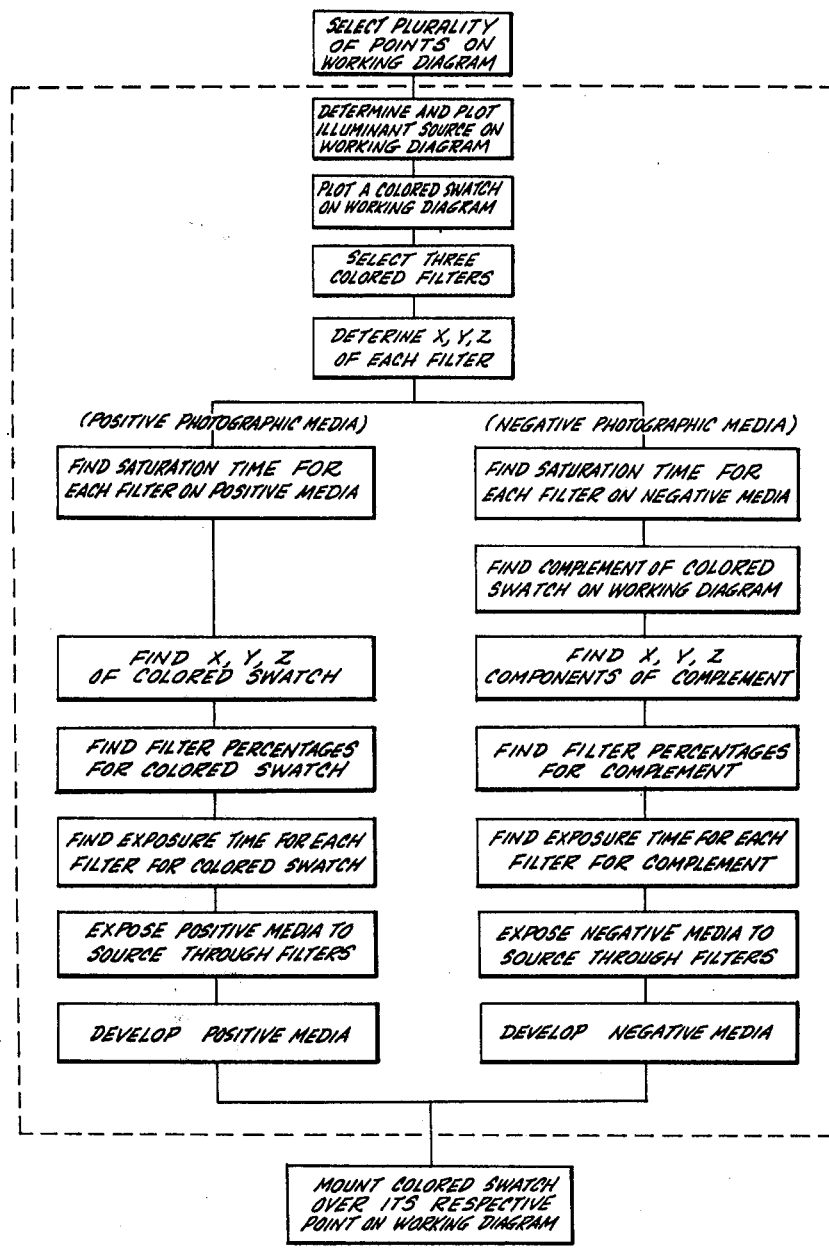

Briefly, according to the method of the present invention, a color reference data base is prepared, such as the diagram shown in FIG. 5, by first selecting a plurality of points located on a working diagram 15 which again has units proportional to those appearing on a standard CIE diagram. As before, working diagram 15 need not include the CIE diagram 14, but it is preferred that the CIE diagram be included to aid in the aforesaid selection of points, since no color visible to the human eye will appear outside the CIE diagram 14. As has been explained, an illuminant source is selected whose color temperature and spectral distribution are the same as that being used to produce the target color. Then, a colored swatch 62 is prepared photographically for each point selected, and the finished color reference diagram is formed by mounting each colored swatch over its respective point on the working diagram 15. Since it is known that on a standard CIE diagram the colors merge imperceptibly into one another, one must keep in mind that the accuracy of the color reference diagram thus compiled depends upon the number of discrete sample points selected. A relatively few sample points give a relatively inaccurate result under the present method, while a relatively large number of sample points will, of course, give much better results. The number of sample points taken is thus determined by the degree of accuracy required by the user. Through the use of a large number of sample points, a color reference data base is generated which has an accuracy sufficient to meet any need of a particular user. Of course, a countervailing factor is that, as the number of sample points increases, the cost of preparing the data base also increases. Thus, some balancing must be done by the user between his need for accuracy, and the cost of preparing a color reference diagram capable of meeting that degree of accuracy.

Figure 6:
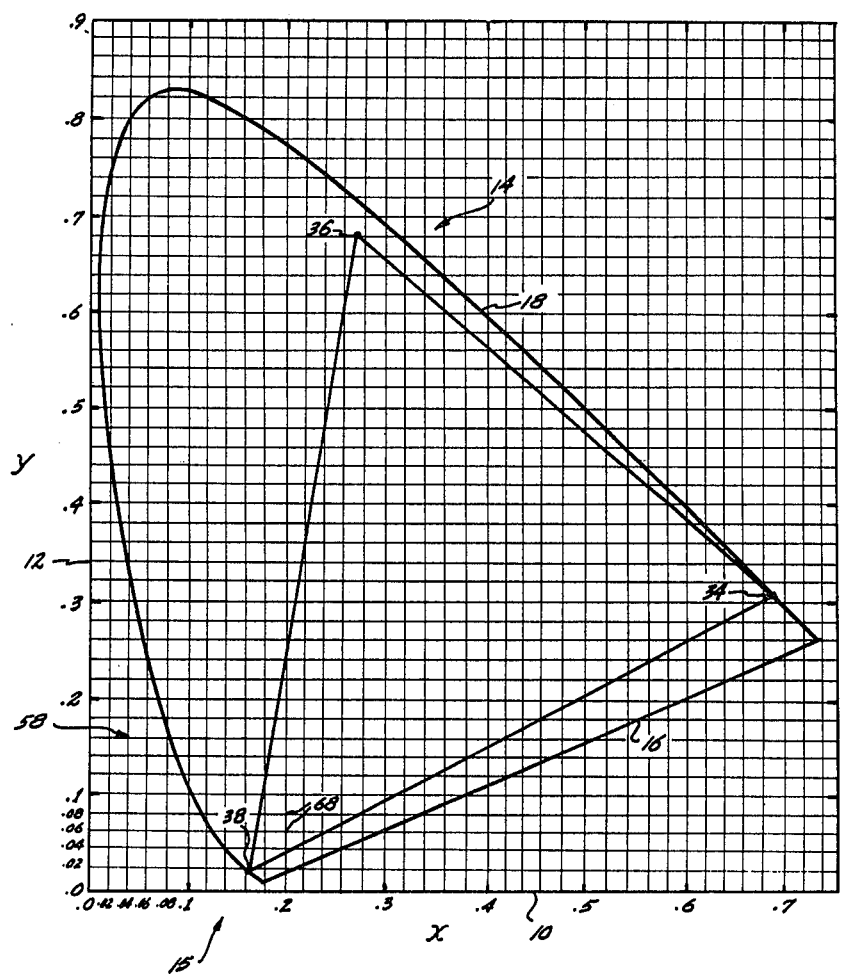
FIG. 6 is a pictorial representation illustrating the use of a working area in preparing a color reference data base according to the present invention.

The plurality of points may, of course, be selected by hand. However, referring now to FIG. 6, in order to provide a uniform and systematic method by which a plurality of points may be selected on the working diagram for use in preparing a color reference diagram or the like, applicants prefer that a grid 58 of uniform spacing be superimposed over a blank, standard CIE diagram 14. Each intersection 68 on the grid is taken as a sample in the preparation of the color reference CIE diagram. Thus, for example, the grid shown in FIG. 6 has a spacing of 0.02 units, wherein the units are arbitrary. Of course, a larger or smaller spacing may be chosen by the user depending on the order of accuracy needed. Or, more frequent points could be chosen for those areas on the CIE diagram in which the user is particularly interested. In addition, it should be emphasized that the grid 58 shown in FIG. 6 is merely used as an example of an organizing chart, and that any other forms of organizing chart or data to help select sample points, is within the scope of the present invention.

After the plurality of points are selected, a comparison of the methods shown in FIGS. 2 and 5 reveals that all of the steps shown encompassed by the dotted line in FIG. 5 are analogous to the corresponding steps shown in FIG. 2. The only difference is that in FIG. 5 the colored swatch and complement of the colored swatch are used, respectively, instead of the target color and complement of the target color of FIG. 2. Inasmuch as the method shown in FIG. 2 has been explained previously in considerable detail, no further discussion of the manner of photographically preparing each colored swatch 62 need again be given.

As an aid in selecting which filters 34, 36, 38 to use in the preparation of the colored swatches 63, it should be recalled that any set of three color filters produces only those colors located on or within the filter triangle they define. Thus, when dealing with positive photographic media, if a set of filters of widely differing colors is selected, such as the red, green and blue filters 34, 36, 38 shown in FIG. 6, a relatively large number of the colored swatches can be produced with only this single set of filters. Thus, by utilizing this technique of selecting filters of widely differing colors, it is seen that the number of filters needed to cover large portions of the working diagram 15 may be greatly reduced.

Of course, the use of a set of filters forming a filter triangle covering a large portion of the working diagram 15 also makes it more probable that any given target color will lie within this filter triangle. Thus, the same set of filters may be used to produce both the needed portion of the color reference diagram and the target color.

It should be again noted that the color temperature of the illuminant source used to produce the color reference data base is an important factor which must be considered. This is because as the color temperature of the illuminant source changes, its color changes too. Accordingly, the illuminant source's location on a standard CIE diagram also changes as its color temperature changes.

One of the outstanding features of the present invention is that once a color reference data base is prepared for an illuminant source of a particular color temperature and spectral distribution, it may be used again as a reference in the future at any time when an illuminant source having the same or similar color temperature and spectral distribution is being used to produce a target color. Further, once a color reference diagram has been prepared for an illuminant source of a particular color temperature, and spectral distribution, it may be easily reproduced by conventional photographic or printing means for use by others in carrying out the present invention. Thus, it is within the scope of the present invention that a series of color reference diagrams or equivalent data bases be prepared, each for an illuminant source of a different color temperature and spectral distribution and particularly for those commonly used in the photographic art. These may then be distributed as an aid to others practicing applicants' present invention.

A technique important to practical target color reproduction according to the present invention involves the determination of saturation time for a particular gray level, since this gives the base time for all colors on that level. This determination is made as follows. A trial exposure is made for a gray sample, using any combination of up to three filters, but the filter combination should be such as to produce a color balance of ⅓ each of cyan, magenta and yellow. The exposed sample is then measured with a densitometer or like instrument (spectrophotometer or colorimeter) that identifies balance of cyan, magenta and yellow, i.e. the grayness of the sample. In the case where a densitometer is used for this measurement, four readouts are given by the instrument. As an example, the gray level of the sample may be 70 and the color densities may be cyan 65, magenta 72 and yellow 59. By adding these three densities, a total of 196 results. Since a color balance is desired, i.e. a relative density of 0.33 0.33 0.33 of a density of 65 65 65, we note that the density balance in the selected example is 33% for cyan, 37% for magenta and 30% for yellow. In the instance of this example, these colors were obtained through the complementary filters Wratten 25, 58 and 47-B, for cyan, magenta and yellow.

Subtracting the percent difference for each color, it is noted that cyan at 33% requires no correction, the magenta requires a reduction of −4% and yellow requires an increase of +3%. At this point a correction factoring system is employed to make a new exposure. In the correction system adopted in this example, the correcting number (on a geometric progression scale) to reduce the magenta density by 4% is 0.9120. This number is then multiplied by the original exposure time, which gives a new time for the magenta exposure. Correspondingly, yellow is 3% under so the correction factor in this instance would be 1.072 to give the new exposure time for yellow.

If it is preferred that the gray level be a different figure, say 66 by way of example instead of 70, the correction figure to arrive at the preferred gray level is 0.942857, applicable to all exposure times. Another sample is exposed, using the revised exposure times and the correction procedure is repeated if necessary until the desired gray balance and gray level are achieved. Once these exposure times are obtained it is next desirable to find the saturation time for that level for all colors. With the correct gray exposure time at hand, the three exposure times are divided by the correct "percentage of filter" amounts for gray, as determined from the chromaticity data base for the illuminant point, as earlier discussed.

Taking the "percentage of filter" amounts for the illuminant point, these figures are divided into the new times for gray and this determines the saturation times for this particular level of the chromaticity diagram for all colors. Using this time, any color can be achieved by multiplying its "percentage of filter" amount by the saturation time.

To illustrate this technique, and using the example initially discussed earlier, the following measurements and calculations occur:

---

1. Time used  10.1 sec. for the 25 filter (for cyan)
              4.2 sec. for the 58 filter (for magenta)
              2.4 sec. for the 47-B filter (for yellow)
2. Sample measured (70) 65 72 59
3. 65+72+59 = 196  65/196 = 33%  72/196 = 37%  59/197 = 30%
4. NEED  33%      NEED  33%      NEED  33%
   HAVE  33%      HAVE  37%      HAVE  30%
           0              +4%            −3%
5.-6.            .9120           1.072
                 × 4.2           × 2.4
       10.1      3.8             2.6           NEW TIME
7. NEED       .66 gray level
   HAVE      .70 gray level     .66/.70 = .942857
       10.1      3.8             2.6
   × .942857  × .942857  × .942857  NEW TIMES for
       9.5       3.6             2.4    .66 gray
10. Assuming that these times for gray are correct, the
    following SATURATION TIMES FOR the .66 level of the
    chromaticity diagram evolve, using the given photo-
    graphic media used in the example:
    9.5/.443458 = 21.4 sec.      3.6/.379670 = 9.4 sec.
    2.4/.176872 = 13.56 sec.

---

Any color can now be exposed for, using these times. Thus, for a dominant wavelength of 410 at the 90% saturation level from the illuminant, can be computed by .083369    .003930    .912701
  × 21.4     × 9.4      × 13.45
  ─────      ─────      ──────
   1.8        .04        12.3

As will be evident, the determinations and operations of the exposure equipment can also be accomplished by computer, utilizing programming techniques known per se. In one prototype equipment at hand, an Apple II computer is used with a so-called x, y table to horizontally move the photographic media under a stationary mask opening through which the media is illuminated downwardly from a stationary illuminant source through selected filters. The computer also interfaces with exposure control mechanism, i.e. the light source and filters. In the prototype arrangement a computer is used with a color TV monitor. All necessary computations to provide the color reference data base for the light source and filters are programmed into the computer in a manner known per se. The photographic media is moved on the x, y table under control of the computer so that the desired exposure point is directly in line with the mask opening and the light source. Filters are moved into line with the illuminant source sequentially and exposure times are also controlled by the computer to reproduce any desired target color in the manner characteristic of the present invention. Repeated exposure to develop an array of target colors can result in an entire data base working area being produced.

Exposure of an entire working area which can of itself be used as a color measuring instrument, or the data acquired from such a reference diagram and the related computer program, can be also used as a color measuring standard.

From the foregoing, various further applications, modifications and adaptations of the methods disclosed by the foregoing preferred embodiments of the present invention will be apparent to those skilled in the art to which the present invention is addressed, within the scope of the following claims.

What is claimed is:

1. A method of preparing a color reference data base in the form of a CIE type diagram comprising the steps of:
    (a) selecting a plurality of color points located in a color data working area of the data base by superimposing a grid on the working area and choosing various intersections of the grid as color points;
    (b) preparing a colored swatch on photographic media having primary color components the same as the primary color components of each color point so selected; and
    (c) placing each colored swatch at its respective color point within the color data working area.

2. A color reference data base, produced by the method of claim 1.

3. A method of preparing a color reference data base comprising the steps of selecting a plurality of color points located in a working area, preparing a colored swatch on photographic media for each color point so selected, and mounting each colored swatch over its respective color point within the working area, each such colored swatch being prepared by:
    (a) selecting a set of up to three color filters which, when located in the working area, determine a filter triangle such that the color point of the colored swatch or the complement thereof lies within or on the filter triangle;
    (b) determining the saturation time for each color filter for the particular photographic media being used;

(c) computing the filter percentage needed for each color filter;

(d) multiplying the saturation time for each color filter by its respective filter percentage to determine its exposure time;

(e) exposing the photographic media through each color filter for its respective exposure time; and (f) developing the exposed photographic media.

4. The method of claim 3, wherein the filter percentage for each color filter is determined such that the sum of the respective filter percentages of the red component of each color filter equals the red component of the colored swatch's respective point, the sum of the respective filter percentages of the green component of each color filter equals the green component of the colored swatch's respective point, and the sum of the respective filter percentages on the blue component of each color filter equals the blue component of the colored swatch's respective point.

5. The method of claim 4, wherein the red, green and blue components of each filter and of each colored swatch are determined by:

(a) noting the x, y, coordinates of its respective point on the working area which equal, respectively, the red and green components; and (b) calculating the blue component by the formula $z = 1 - (x + y)$.

6. The method of claim 5, wherein the x, y coordinates of each filter are determined by referring to its manufacturer's reference data.

7. The method of claim 5, wherein the x, y coordinates for each color filter are determined spectrophotometrically.

8. The method of claim 5, wherein, when using positive photographic media, the x, y coordinates for each colored swatch's respective point are read directly from the point's location on the working diagram.

9. A color reference data base produced by the method of claim 5.

10. The method of claim 5, wherein, when using negative photographic media, the x, y coordinates of each colored swatch are determined by:

(a) locating a point for an illuminant source used in the working area;

(b) utilizing a standard CIE diagram in conjunction with the working area;

(c) extending a straight line through the colored swatch's respective point and the point for the illuminant source, to opposite sides of the standard CIE diagram;

(d) determining the percentage of the distance on the straight line that the colored swatch's respective point lies between the point for the illuminant source and the near side of the filter triangle; and (e) noting the x, y coordinates of a point located on the straight line a percentage of the distance from the point for the illuminant source to the far side of the filter triangle which is the same as said percentage of the distance for said colored swatch's respective point.

11. A color reference data base produced by the method of claim 10.

12. A method of preparing a colored swatch comprising the steps of:

(a) selecting a point in a color data working area corresponding to the colored swatch to be prepared;

(b) selecting a set of up to three color filters which, when plotted in the working area, determine a filter triangle such that the corresponding point of the colored swatch or the complement thereof lies within or on the filter triangle;

(c) determining the saturation time for each color filter, for the particular photographic media being used;

(d) computing the filter percentage needed for each color filter;

(e) multiplying the saturation time for each color filter by its respective filter percentage to determine its exposure time;

(f) exposing the photographic media through each color filter for its respective exposure time; and (g) developing the exposed photographic media.

13. A colored swatch produced by the method of claim 12.

14. The method of claim 12, wherein the filter percentage for each color filter is determined on the basis that the sum of the respective filter percentages of the red component of each color filter equals the red component of the colored swatch's corresponding point, the sum of the respective filter percentages of the green component of each color filter equals the green component of the colored swatch's corresponding point, and the sum of the respective filter percentages on the blue component of each color filter equals the blue component of the colored swatch's corresponding point.

15. The method of claim 14, wherein the red, green and blue components of each filter and of the colored swatch are determined by:

(a) noting the x, y coordinates of its respective point in the working area which equal, respectively, its red and green components; and (b) calculating the blue component by the formula $z = 1 - (x + y)$.

16. The method of claim 15, wherein the x, y coordinates of each filter are determined by referring to its manufacturer's reference data.

17. The method of claim 15, wherein the x, y coordinates for each color filter are determined spectrophotometrically.

18. The method of claim 15, wherein, when using positive photographic media, the x, y coordinates for the colored swatch's corresponding point are read directly from said corresponding point in the working area.

19. A colored swatch produced by the method of claim 15.

20. The method of claim 15, wherein, when using negative photographic media, the x, y coordinates of the colored swatch are determined by:

(a) locating a point for the illuminant source used in the working area;

(b) utilizing a standard CIE diagram in conjunction with the working area;

(c) extending a straight line through the colored swatch's corresponding point and the plotted point for the illuminant source, to opposite sides of the filter triangle;

(d) determining the percentage of the distance on the straight line that the colored swatch's corresponding point lies between the plotted point for the illuminant source and the near side of the filter triangle;

and (e) noting the x, y coordinates of a point located on the straight line a percentage of the distance from the point for the illuminant source to the far side of the filter triangle which is the same as said percentage of the distance for said colored swatch's corresponding point.

21. A colored swatch produced by the method of claim 20.

* * * * *